United States Patent
Choi et al.

(10) Patent No.: US 12,538,669 B2
(45) Date of Patent: Jan. 27, 2026

(54) LIGHT EMITTING DISPLAY DEVICE INCLUDING PIXEL ELECTRODE OPENING EXTENDING PARALLEL TO AND OVERLAPPING DATA LINE

(71) Applicant: Samsung Display Co., Ltd., Yongin-Si (KR)

(72) Inventors: Jun Won Choi, Seoul (KR); Jae Won Kim, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 753 days.

(21) Appl. No.: 17/858,741

(22) Filed: Jul. 6, 2022

(65) Prior Publication Data

US 2023/0157100 A1    May 18, 2023

(30) Foreign Application Priority Data

Nov. 15, 2021    (KR) .......................... 10-2021-0156577

(51) Int. Cl.
*H10K 59/131* (2023.01)
*H10K 59/122* (2023.01)
*H10K 59/35* (2023.01)

(52) U.S. Cl.
CPC ......... *H10K 59/131* (2023.02); *H10K 59/122* (2023.02); *H10K 59/352* (2023.02)

(58) Field of Classification Search
CPC ... H10K 59/131; H10K 59/122; H10K 59/352
See application file for complete search history.

(56) References Cited

U.S. PATENT DOCUMENTS

| 2008/0030640 | A1* | 2/2008 | Hur ...................... G02F 1/13624 349/48 |
| 2010/0007837 | A1 | 1/2010 | Ham et al. |
| 2011/0157504 | A1* | 6/2011 | Kimura ................ G09G 3/3648 349/38 |
| 2011/0170045 | A1* | 7/2011 | Lee .................... G02F 1/136259 257/E33.001 |
| 2022/0102463 | A1* | 3/2022 | Park ..................... G09G 3/3233 |

FOREIGN PATENT DOCUMENTS

| CN | 107808892 A * | 3/2018 | .......... H10K 59/124 |
| KR | 10-2010-0005883 A | 1/2010 | |
| KR | 10-0940573 B1 | 2/2010 | |
| KR | 10-2010-0058223 A | 6/2010 | |
| KR | 10-1431468 B1 | 8/2014 | |
| KR | 10-2019-0064085 A | 6/2019 | |
| KR | 10-2021-0123245 A | 10/2021 | |

OTHER PUBLICATIONS

English translation of CN 107808892 A (Year: 2018).*

* cited by examiner

*Primary Examiner* — Lex H Malsawma
(74) *Attorney, Agent, or Firm* — Innovation Counsel LLP

(57) ABSTRACT

A light emitting display device is disclosed that includes a substrate, a first insulating layer, a data line, a second insulating layer, a pixel electrode, and an emission layer. The first insulating layer is disposed on the substrate. The data line is disposed on the first insulating layer and transmits a data voltage. The second insulating layer is disposed on the data line. The pixel electrode is disposed on the second insulating layer. The emission layer is disposed on the pixel electrode. The pixel electrode includes at least one first opening extending in parallel to the data line and overlapping the data line.

20 Claims, 9 Drawing Sheets

LIGHT EMITTING DISPLAY DEVICE INCLUDING PIXEL ELECTRODE OPENING EXTENDING PARALLEL TO AND OVERLAPPING DATA LINE

CROSS-REFERENCE TO RELATED APPLICATION

This application claims priority to and the benefit of Korean Patent Application No. 10-2021-0156577 filed in the Korean Intellectual Property Office on Nov. 15, 2021, the entire contents of which are incorporated herein by reference.

BACKGROUND

(a) Technical Field

This disclosure relates to a display device. More particularly, this disclosure relates to a light emitting display device including light emitting diodes.

(b) Description of the Related Art

A light emitting display device includes light emitting diodes corresponding to pixels, and may display an image by controlling the luminance of each light emitting diode. Unlike a light-receiving display device such as a liquid crystal display, the light emitting display device does not require a light source such as a backlight, and thus the thickness and weight may be reduced. In addition, the light emitting display device has characteristics such as high luminance, a high contrast ratio, high color reproduction, and a high response rate, and thus it may display high-quality images.

Due to these advantages, the light emitting display devices are applied to various electronic devices, for example, mobile devices such as smart phones, tablets, or laptops, monitors, and televisions, and are in the spotlight as display devices for vehicles.

The light emitting display device may include a pixel circuit for configuring the pixels or driving the pixels.

The pixel circuit may include a light emitting diode, a transistor, a capacitor, and a signal line. Undesired parasitic capacitance may be generated in the pixel circuit. The parasitic capacitance may be a problem when the display panel is particularly driven at a high rate.

The above information disclosed in this Background section is only for enhancement of understanding of the background of the invention, and therefore it may contain information that does not form the prior art that is already known in this country to a person of ordinary skill in the art.

SUMMARY

Embodiments may provide a light emitting display device having reduced parasitic capacitance.

An embodiment of a light emitting display device may include: a substrate; a first insulating layer disposed on the substrate; a data line disposed on the first insulating layer and transmitting a data voltage; a second insulating layer disposed on the data line; a pixel electrode disposed on the second insulating layer; and an emission layer disposed on the pixel electrode. The pixel electrode includes at least one first opening extending in parallel to the data line and overlapping the data line.

The data line may traverse the pixel electrode.

The emission layer may include portions divided with the at least one first opening therebetween.

The light emitting display device may further include a pixel defining layer disposed on the second insulating layer and having an opening overlapping the pixel electrode. The opening may include portions spaced with the at least one first opening therebetween.

The pixel electrode may further include a second opening extending in a direction crossing an extending direction of the at least one first opening.

The first opening may be connected to the second opening.

The emission layer may include portions spaced with the second opening therebetween.

The at least one first opening may include a plurality of first openings connected to each other.

The at least one first opening may include a plurality of first openings separated from each other.

The light emitting display device may further include a first pixel and a second pixel disposed in a direction in which the at least one first opening extends, and a third pixel disposed near the first pixel and the second pixel in a direction crossing the direction in which the at least one first opening extends. The pixel electrode may be a pixel electrode of the third pixel.

The first pixel, the second pixel, and the third pixel may respectively display red, green, and blue. A region of the third pixel may be greater than a region of each of the first pixel and the second pixel.

The pixel electrode may be a pixel electrode of the first pixel or the second pixel.

An embodiment of provides a light emitting display device may include: a first pixel, a second pixel, and a third pixel displaying different colors and respectively including a first pixel electrode, a second pixel electrode, and a third pixel electrode; and a first data line, a second data line, and a third data line for transmitting a data voltage to the first pixel, the second pixel, and the third pixel, respectively. In a top plan view, the third data line traverses the third pixel electrode, and in a top plan view, the third pixel electrode includes a first opening overlapping the third data line.

The first opening may extend in parallel to the third data line. A width of the first opening may be greater than a width of the third data line.

The third pixel may include an emission layer disposed on the third pixel electrode. The emission layer may include portions disposed on a first side and a second side of the first opening and spaced from each other.

The third pixel electrode may further include a second opening extending in a direction crossing an extending direction of the first opening.

The first opening may be connected to the second opening.

The emission layer may include portions disposed on a first side and a second side of the second opening and spaced from each other.

The first pixel, the second pixel, and the third pixel may respectively display a red color, a green color, and a blue color. A region of the third pixel may be respectively greater than a region of each of the first pixel and the second pixel.

The light emitting display device may further include a driving voltage line traversing the third pixel electrode to extend in a same direction as a direction in which the data line extends, and transmitting a driving voltage to the third pixel.

According to the embodiments, the parasitic capacitance between the data line and the pixel electrode may be reduced from the light emitting display device, and hence, displaying quality of the display device may be improved by improving, for example, generation of stains or non-uniformity of luminance in a displayed image when the display panel is driven at a high refresh rate. According to the embodiments, advantageous effects recognizable in the entire specification may be obtained.

DETAILED DESCRIPTION OF THE EMBODIMENTS

In the following detailed description, only certain embodiments have been shown and described, simply by way of illustration.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless explicitly described to the contrary, the words "comprise" and "include" and their variations such as "comprises," "comprising," "includes," and "including" will be understood to imply the inclusion of stated elements, but not the exclusion of any other elements.

Throughout the specification, when it is described that a part is "connected (in contact with, coupled)" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

Terms "x", "y", and "z" are used, and here, "x" is a first direction, "y" is a second direction that is perpendicular to the first direction, and "z" is a third direction that is perpendicular to the first direction and the second direction.

As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

Figure 1:
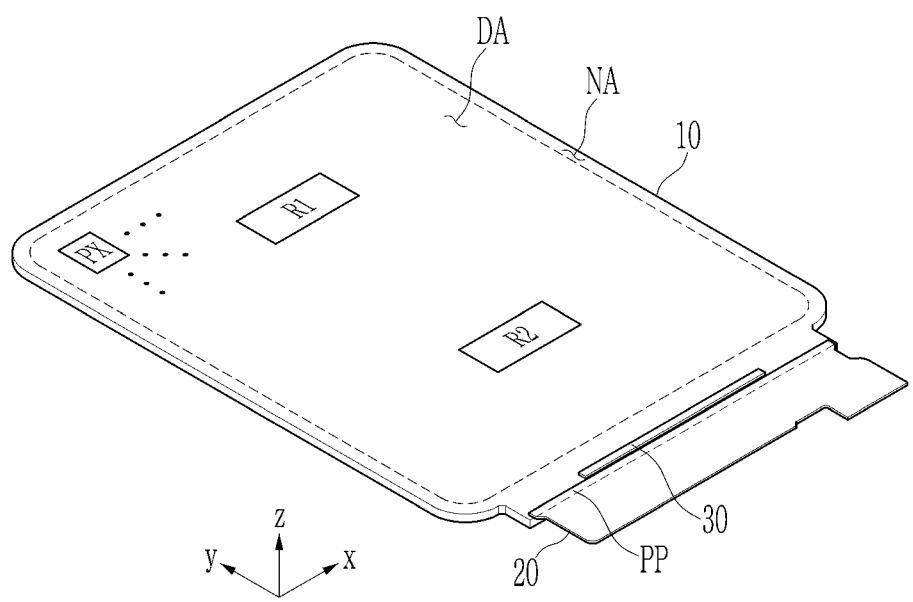
FIG. 1 shows a perspective view of a light emitting display device according to an embodiment.

FIG. 1 shows a perspective view of a light emitting display device according to an embodiment.

Referring to FIG. 1, the light emitting display device (also referred to as a display device) may include a display panel 10, a flexible printed circuit film 20 bonded to the display panel 10, and a driving unit including an integrated circuit chip 30.

The display panel 10 may include a display area DA that corresponds to a screen for displaying images, and a non-display area NA in which circuits or signal lines for generating or transmitting various signals that are applied to the display area DA are disposed. The non-display area NA may surround the display area DA. An inside and an outside of the dotted quadrangle may respectively correspond to the display area DA and the non-display area NA.

Pixels PX may be disposed as a matrix in the display area DA of the display panel 10.

Signal lines such as gate lines (also referred to as scan lines), data lines, or driving voltage lines may be disposed in the display area DA. The gate lines may substantially extend in the first direction x, and the data lines and the driving voltage lines may substantially extend in the second direction y. The gate lines, the data lines, and the driving voltage lines are connected to the respective pixels PX, and the pixels PX may receive a gate signal (also referred to as a scan signal), a data voltage, and a driving voltage from the signal lines. The pixel PX may be realized as a light-emitting device such as a light emitting diode LED.

The display area DA may include a touch sensor for sensing a contact or non-contact touch of a user. The display area DA that is substantially a quadrangle is shown, and the display area DA may have various shapes such as a polygon, a circle, or an oval in addition to the quadrangle.

A pad portion PP in which pads for receiving signals from the outside of the display panel 10 may be positioned in the non-display area NA of the display panel 10. The pad portion PP may be positioned in the first direction x along an edge of the display panel 10. The flexible printed circuit film 20 may be bonded to the pad portion PP, and pads of the flexible printed circuit film 20 may be electrically connected to the pads of the pad portion PP.

A driving unit for generating or processing various signals for driving the display panel 10 may be positioned in the non-display area NA of the display panel 10. The driving unit may include a data driver for applying a data voltage to the data lines, a gate driver for applying a gate signal to the gate lines, and a signal controller for controlling the data driver and the gate driver. The pixels PX may receive the data voltage at predetermined timings according to gate signals generated by the gate driver. The gate driver may be integrated to the display panel 10, and may be positioned on at least a first side of the display area DA. The data driver and the signal controller may be provided as an integrated circuit chip (also referred to as a driving IC chip) 30, and the integrated circuit chip 30 may be installed in the non-display area NA of the display panel 10. The integrated circuit chip 30 may be installed in the flexible printed circuit film 20 and may be electrically connected to the display panel 10.

Figure 2:
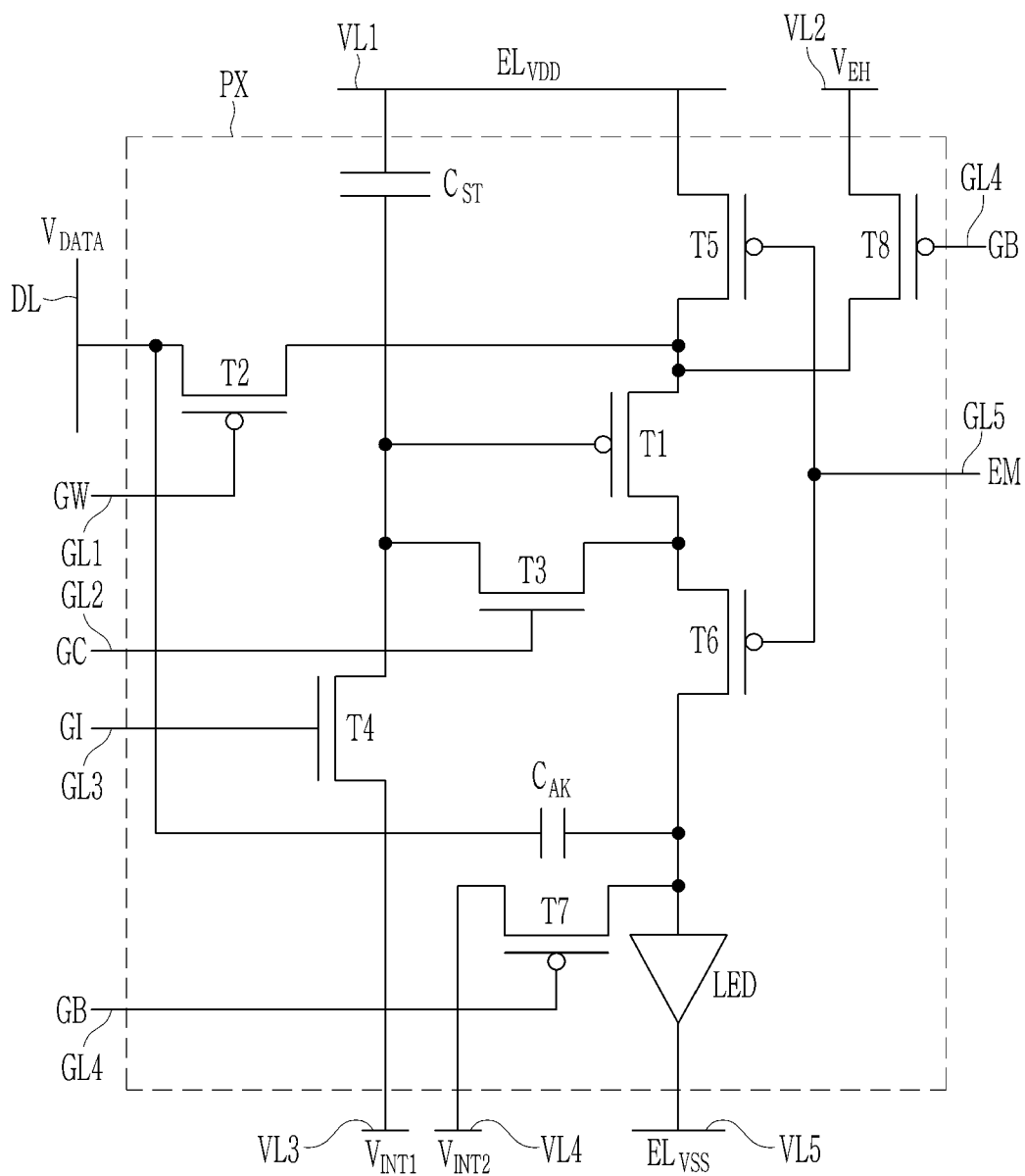
FIG. 2 shows a circuit diagram of one pixel of a display device according to an embodiment.

FIG. 2 shows a circuit diagram of one pixel of a display device according to an embodiment.

One pixel PX may include transistors T1 to T8, a storage capacitor $C_{ST}$, and a light emitting diode LED connected to signal lines GL1 to GL5, DL, and VL1 to VL5.

The signal lines GL1 to GL5, DL, and VL1 to VL5 may include gate lines GL1 to GL5, a data line DL, and voltage lines VL1 to VL5. The gate lines GL1 to GL5 may be electrically connected to the gate driver, and the data line DL may be electrically connected to the data driver. The gate lines GL1 to GL5 may include a scan line GL1, an inverted scan line GL2, an initialization control line GL3, a bypass control line GL4, and a light emitting control line GL5. The voltage lines VL1 to VL5 may include a driving voltage line VL1, a reference voltage line VL2, a first initialization voltage line VL3, a second initialization voltage line VL4, and a common voltage line VL5. The reference voltage line VL2, the first initialization voltage line VL3, the second initialization voltage line VL4, and the common voltage line VL5 may be respectively connected to a voltage generator.

The transistors T1 to T8 may include a first transistor T1, a second transistor T2, a third transistor T3, a fourth transistor T4, a fifth transistor T5, a sixth transistor T6, a seventh transistor T7, and an eighth transistor T8. The second to eighth transistors T2 to T8 may receive respective gate signals through the gate lines GL1 to GL5.

The scan line GL1 may transmit a scan signal GW to the second transistor T2. The inverted scan line GL2 may transmit an inverted scan signal GC to the third transistor T3. The scan signal GW and the inverted scan signal GC may have opposite polarities to each other. For example, when a high voltage is applied to the scan line GL1, a low voltage may be applied to the inverted scan line GL2.

The initialization control line GL3 may transmit an initialization control signal GI to the fourth transistor T4. The bypass control line GL4 may transmit a bypass signal GB to the seventh transistor T7. The bypass control line GL4 may also transmit the bypass signal GB to the eighth transistor T8. The bypass control line GL4 may be the scan line GL1 connected to the pixel PX that is adjacent in the second direction y. The light emitting control line GL5 may transmit a light emitting control signal EM to the fifth transistor T5 and the sixth transistor T6.

The data line DL may transmit a data voltage $V_{DATA}$. The driving voltage line VL1 may transmit a driving voltage $EL_{VDD}$ (a first power voltage or a high-potential power voltage). The reference voltage line VL2 may transmit a reference voltage $EL_{EH}$. The first initialization voltage line VL3 may transmit a first initialization voltage $V_{INT1}$, the second initialization voltage line VL4 may transmit a second initialization voltage $V_{INT2}$, and the common voltage line VL5 may transmit a common voltage $EL_{VSS}$ (a second power voltage or low-potential power voltage). Luminance of the light emitting diode LED may be controlled according to the data voltage $V_{DATA}$ applied to the pixel PX. The driving voltage $EL_{VDD}$, the reference voltage $EL_{EH}$, the first initialization voltage $V_{INT1}$, the second initialization voltage $V_{INT2}$, and the common voltage $EL_{VSS}$ may respectively be a DC voltage with a predetermined level.

Regarding the transistors T1 to T8, the first transistor T1, which is a driving transistor, may be a p-type transistor and may include a polycrystalline semiconductor. The first transistor T1 may control a driving current output to an anode of the light emitting diode LED according to the data voltage $V_{DATA}$ applied to a gate electrode of the first transistor T1. The gate electrode of the first transistor T1 may be connected to a first electrode of the storage capacitor $C_{ST}$. A first electrode of the first transistor T1 may be connected to a second electrode of the second transistor T2 and may pass through the fifth transistor T5 and may be connected to the driving voltage line VL1. A second electrode of the first transistor T1 may pass through the sixth transistor T6 and may be connected to the anode of the light emitting diode LED.

The second transistor T2, which is a switching transistor, may be a p-type transistor and may include a polycrystalline semiconductor. A gate electrode of the second transistor T2 may be connected to the scan line GL1, the first electrode of the second transistor T2 may be connected to the data line DL, and the second electrode of the second transistor T2 may be connected to the first electrode of the first transistor T1. When the second transistor T2 is turned on by a gate-on voltage (or a low voltage) of the scan signal GW transmitted through the scan line GL1, the data voltage $V_{DATA}$ transmitted through the data line DL may be transmitted to the first electrode of the first transistor T1.

The third transistor T3 may be an n-type transistor and may include an oxide semiconductor. The third transistor T3 may electrically connect the second electrode and the gate electrode of the first transistor T1. As a result, a compensation voltage into which the data voltage $V_{DATA}$ is changed through the first transistor T1 may be transmitted to a first electrode of the storage capacitor $C_{ST}$. A gate electrode of the third transistor T3 may be connected to the inverted scan line GL2, and a first electrode of the third transistor T3 may be connected to the second electrode of the first transistor T1. A second electrode of the third transistor T3 may be connected to the first electrode of the storage capacitor $C_{ST}$ and the gate electrode of the first transistor T1. When the third transistor T3 is turned on by a gate-on voltage (or a high voltage) of the inverted scan signal GC received through the inverted scan line GL2, the third transistor T3 may connect the gate electrode of the first transistor T1 and the second electrode of the first transistor T1. The voltage applied to the gate electrode of the first transistor T1 may be stored in the storage capacitor $C_{ST}$, and the storage capacitor $C_{ST}$ may maintain a voltage at the gate electrode of the first transistor T1 for one frame.

The fourth transistor T4 may be an n-type transistor and may include an oxide semiconductor. The fourth transistor T4 may initialize the gate electrode of the first transistor T1 and the first electrode of the storage capacitor $C_{ST}$ with the first initialization voltage $V_{INT1}$. A gate electrode of the fourth transistor T4 may be connected to the initialization control line GL3, and a first electrode of the fourth transistor T4 may be connected to the first initialization voltage line VL3. A second electrode of the fourth transistor T4 may be connected to the first electrode of the storage capacitor $C_{ST}$ and the gate electrode of the first transistor T1. When the fourth transistor T4 is turned on by a gate-on voltage (high voltage) of the initialization control signal GI received through the initialization control line GL3, the first initialization voltage $V_{INT1}$ may be applied to the gate electrode of the first transistor T1 and the first electrode of the storage capacitor $C_{ST}$.

The fifth transistor T5 may be a p-type transistor and may include a polycrystalline semiconductor. The fifth transistor T5 may transmit the driving voltage $EL_{VDD}$ applied through the driving voltage line VL1 to the first transistor T1. A gate electrode of the fifth transistor T5 may be connected to the light emitting control line GL5, a first electrode of the fifth transistor T5 may be connected to the driving voltage line VL1, and a second electrode of the fifth transistor T5 may be connected to the first electrode of the first transistor T1.

The sixth transistor T6 may be a p-type transistor and may include a polycrystalline semiconductor. The sixth transistor T6 may transmit the driving current output by the first transistor T1 to the light emitting diode LED. A gate electrode of the sixth transistor T6 may be connected to the light emitting control line GL5, a first electrode of the sixth transistor T6 may be connected to the second electrode of the first transistor T1, and a second electrode of the sixth transistor T6 may be connected to the anode of the light emitting diode LED.

The seventh transistor T7 may be a p-type transistor and may include a polycrystalline semiconductor. The seventh transistor T7 may initialize the anode of the light emitting diode LED. A gate electrode of the seventh transistor T7 may be connected to the bypass control line GL4, a first electrode of the seventh transistor T7 may be connected to the anode of the light emitting diode LED, and a second electrode of the seventh transistor T7 may be connected to the second initialization voltage line VL4. When the seventh transistor T7 is turned on by a gate-on voltage (or a low voltage) of the bypass signal GB, the second initialization voltage $V_{INT2}$ may be applied to the anode of the light emitting diode LED.

The eighth transistor T8 may be a p-type transistor and may include a polycrystalline semiconductor. A gate electrode of the eighth transistor T8 may be connected to the bypass control line GL4, a first electrode of the eighth transistor T8 may be connected to the reference voltage line VL2, and a second electrode of the eighth transistor T8 may be connected to the first electrode of the first transistor T1. When the eighth transistor T8 is turned on by a gate-on voltage (or a low voltage) of the bypass signal GB, the reference voltage $V_{EH}$ may be applied to the first electrode of the first transistor T1.

A second electrode of the storage capacitor $C_{ST}$ may be connected to the driving voltage line VL1. A cathode of the light emitting diode LED may be connected to the common voltage line VL5 for transmitting the common voltage $EL_{VSS}$.

A parasitic capacitor $C_{AK}$ may be disposed between the data line DL and the anode of the light emitting diode LED. When the display device is driven at a high rate (e.g., a frequency of about 240 Hz), a lower region (e.g., a region of R2 in FIG. 1) of the display panel may be a blank frame while an upper region (e.g., a region of R1 in FIG. 1) of the display panel is an active frame. The bypass signal GB is applied to the pixel circuit of the upper region and the pixel circuit of the lower region so the second initialization voltage $V_{INT2}$ may be applied to the anode of the light emitting diode LED of the lower region. When the data voltage $V_{DATA}$ for the upper region is changed, the second initialization voltage $V_{INT2}$ applied to the anode of the light emitting diode LED of the lower region is changed by the parasitic capacitance $C_{AK}$ between the data line DL and the anode, and stains (changes of luminance) may be generated in the lower region. The generation of stains may be reduced by reducing capacity of the parasitic capacitance $C_{AK}$, and an embodiment for reducing the capacity of the parasitic capacitance $C_{AK}$ will be described in a later portion of the present specification.

In addition, differing from the shown embodiment, the third transistor T3 and the fourth transistor T4 may include polycrystalline semiconductors and may be p-type transistors. In the shown embodiment, the pixel PX includes eight transistors T1 to T8 and one storage capacitor $C_{ST}$, and a number of the transistors, a number of the capacitors, and their connections are modifiable in many ways.

Figure 3:
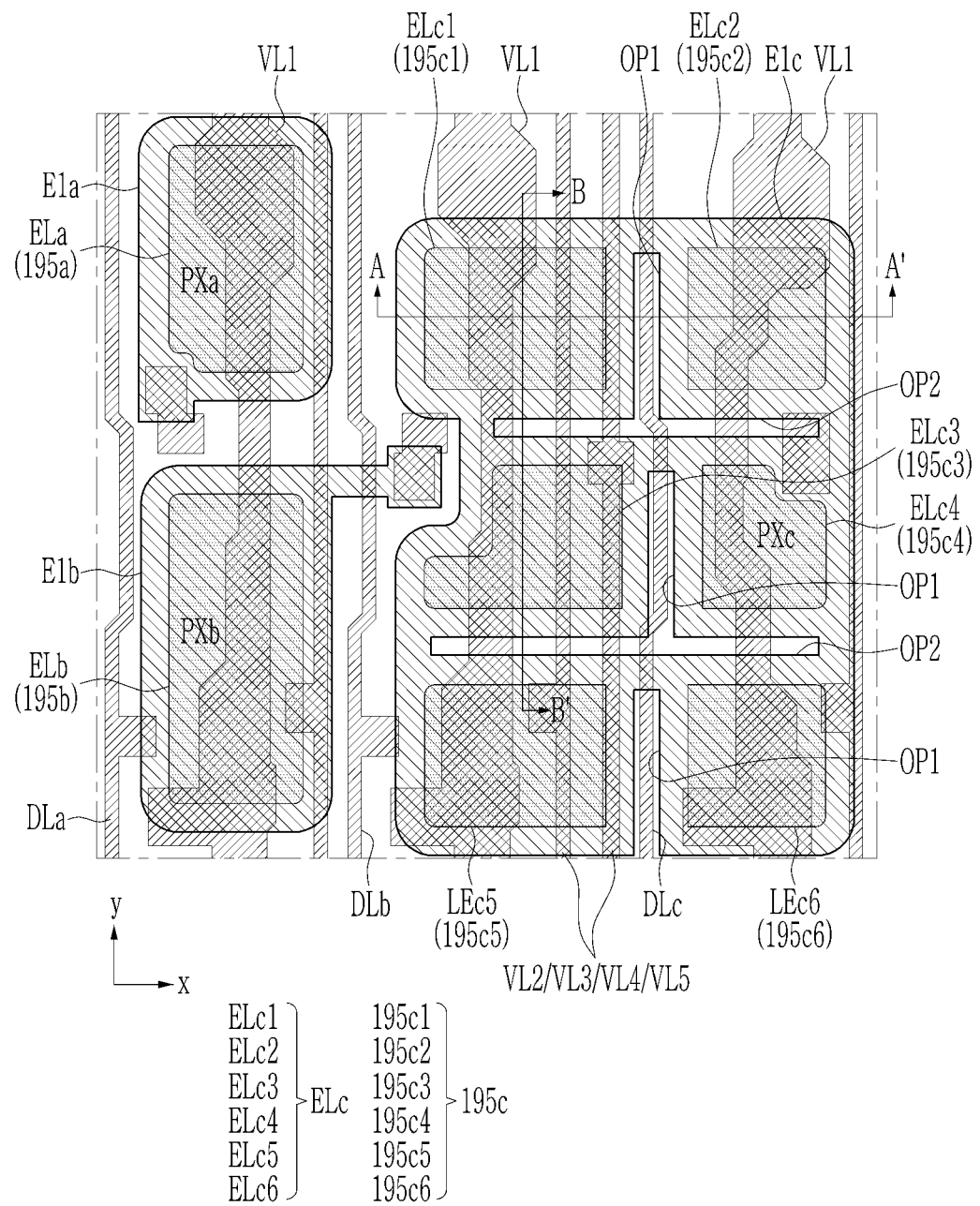
FIG. 3 shows a top plan view of pixels disposed in a display area of a light emitting display device according to an embodiment.
Figure 4:
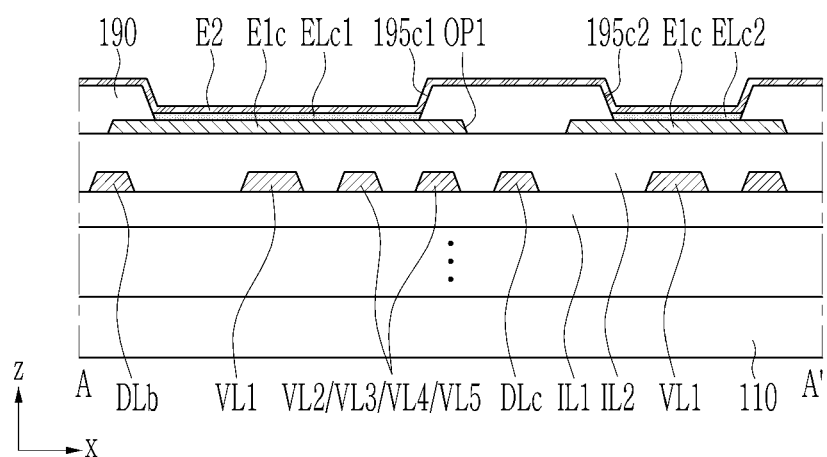
FIG. 4 shows a cross-sectional view with respect to a line A-A' of FIG. 3.
Figure 5:
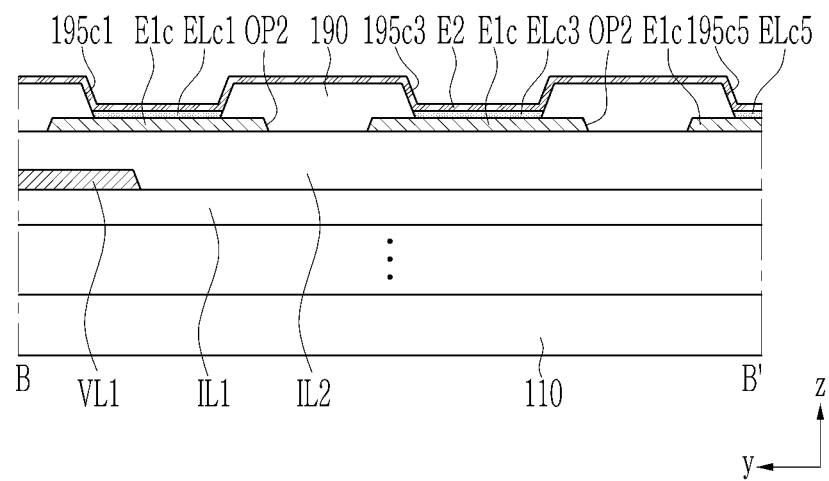
FIG. 5 shows a cross-sectional view with respect to a line B-B' of FIG. 3.

FIG. 3 shows a top plan view of pixels disposed in a display area of a light emitting display device according to an embodiment, FIG. 4 shows a cross-sectional view with respect to a line A-A' of FIG. 3, and FIG. 5 shows a cross-sectional view with respect to a line B-B' of FIG. 3. To avoid complexity of the drawings, constitutional elements for indicating characteristics of the present embodiment from among the constitutional elements described with reference to FIG. 2 are generally shown.

FIG. 3 shows pixels PXa, PXb, and PXc disposed in the display area DA of the display panel 10. Three pixels are shown, and the pixels PXa, PXb, and PXc may be regularly disposed in a matrix direction in the display area DA. The pixels PXa, PXb, and PXc may include a first pixel PXa, a second pixel PXb, and a third pixel PXc. The first pixel PXa, the second pixel PXb, and the third pixel PXc may display different colors and may display one of primary colors. For example, one of the first pixel PXa, the second pixel PXb, and the third pixel PXc may display a red color, another may display a green color, and the other may display a blue color. For example, the first pixel PXa may display the red color, the second pixel PXb may display the green color, and the third pixel PXc may display the blue color. A region of the third pixel PXc may be wider than a region of the first pixel PXa or the second pixel PXb.

The first pixel PXa, the second pixel PXb, and the third pixel PXc may be disposed to be evenly distributed. For example, the first pixel PXa and the second pixel PXb may be alternately and repeatedly disposed in the second direction y. The first and second pixels PXa and PXb and the third pixel PXc may be alternately and repeatedly disposed in the first direction x. Disposal of the pixels PXa, PXb, and PXc are changeable in various ways.

The first pixel PXa, the second pixel PXb, and the third pixel PXc may respectively include a first pixel electrode E1a, a second pixel electrode E1b, and a third pixel electrode E1c. A region of the third pixel electrode E1c may be wider than the region of the first pixel electrode E1a or the second pixel electrode E1b. The third pixel electrode E1c may include at least one first opening OP1 substantially extending in the second direction. The third pixel electrode E1c may include at least one second opening OP2 substantially extending in the first direction. The first opening OP1 may/may not be connected to the second opening OP2. Three first openings OP1 and two second openings OP2 are formed according to an embodiment, and the number of the first openings OP1 and the second openings OP2 is modifiable in various ways.

The first pixel PXa, the second pixel PXb, and the third pixel PXc may respectively include a first emission layer ELa, a second emission layer ELb, and a third emission layer ELc. The third emission layer ELc may include portions ELc1 to ELc6 separated by the first opening OP1 and the second opening OP2.

The data lines DLa, DLb, and DLc may be positioned to be near the pixels PXa, PXb, and PXc or partially overlap them. The data lines DLa, DLb, and DLc may substantially extend in the second direction y. The data lines DLa, DLb, and DLc may include a first data line DLa for transmitting the data voltage to the first pixel PXa, a second data line DLb for transmitting the data voltage to the second pixel PXb, and a third data line DLc for transmitting the data voltage to the third pixel PXc. The third data line DLc may traverse the third pixel electrode E1c and may extend further because of a spatial restriction for disposing the pixels PXa, PXb, and PXc and wires. By this, coupling between the third data line DLc and the third pixel electrode E1c may be a problem. To solve the problem, the first opening OP1 may be formed in the third pixel electrode E1c to overlap the third data line DLc, and the region where the third pixel electrode E1c overlaps the third data line DLc may be reduced. Accordingly, the parasitic capacitance $C_{AK}$ between the third pixel electrode E1c and the third data line DLc may be reduced, and image quality defects such as generation of stains caused by the parasitic capacitance $C_{AK}$ may be improved. For example, when the first opening OP1 is formed in the third pixel electrode E1c as shown above, capacitance between the third pixel electrode E1c and the third data line DLc may be reduced to about ½ to about ⅓, compared to the case in which the first opening OP1 is not formed therein. It may be more advantageous in reducing the parasitic capacitance $C_{AK}$ that the width of the first opening OP1 is greater than the width of the third data line DLc, and the former may be substantially equal to or less than the latter.

The driving voltage line VL1 may substantially extend in the second direction y, and it may overlap the first pixel PXa and the second pixel PXb or may overlap the third pixel PXc. Voltage lines such as the reference voltage line VL2, the first initialization voltage line VL3, the second initialization voltage line VL4, or the common voltage line VL5 may substantially extend in the second direction y, and may or may not overlap the pixels PXa, PXb, and PXc.

Referring to FIG. 3, FIG. 4, and FIG. 5, the display panel 10 may include a substrate 110 and layers and parts positioned on the substrate 110. In detail, a first insulating layer IL1 may be positioned on the substrate 110. Although not shown, transistors, capacitors, and signal lines configuring a pixel circuit for driving the pixels PXa, PXb, and PXc may be positioned between the substrate 110 and the first insulating layer IL1, which will be described in a later part of the present specification.

The data lines DLa, DLb, and DLc may be positioned on the first insulating layer IL1. The driving voltage line VL1 may be positioned on the first insulating layer IL1, and the reference voltage line VL2, the first initialization voltage line VL3, the second initialization voltage line VL4, or the common voltage line VL5 may be positioned thereon.

A second insulating layer IL2 may be positioned on the data lines DLa, DLb, and DLc and the voltage lines VL1 to VL5.

The first pixel electrode E1a, the second pixel electrode E1b, and the third pixel electrode E1c may be positioned on the second insulating layer IL2. The first pixel electrode E1a may be the anode of the light emitting diode LED configuring the first pixel PXa. The second pixel electrode E1b may be the anode of the light emitting diode LED configuring the second pixel PXb. The third pixel electrode E1c may be the anode of the light emitting diode LED configuring the third pixel PXc. The third pixel electrode E1c may include the openings OP1 and OP2. The openings OP1 and OP2 may respectively have a slit shape and may penetrate the third pixel electrode E1c in a thickness direction (or the third direction z). The openings OP1 and OP2 may include a first opening OP1 substantially extending in the second direction y and a second opening OP2 substantially extending in the first direction x. The first opening OP1 may extend to be parallel to the third data line DLc and overlap the same. Accordingly, the region in which the third pixel electrode E1c overlaps the third data line DLc may be reduced, and the coupling and the parasitic capacitance $C_{AK}$ between the third pixel electrode E1c and the third data line DLc may be reduced. To further reduce the parasitic capacitance $C_{AK}$, the width of the first opening OP1 may be greater than the width of the third data line DLc, and the third data line DLc may be positioned in the first direction x in the first opening OP1.

The first opening OP1 and the second opening OP2 may discharge gas generated by the second insulating layer IL2. The second insulating layer IL2 may be formed by coating an organic insulating material including an organic solvent, an initiator, and a binder and curing the same. A material remaining in the second insulating layer IL2 or a decomposed material may be discharged as a gas in a subsequent process after the second insulating layer IL2 is formed or during use of the display device. This phenomenon will be referred to as outgassing. The discharged gas (particularly, after manufacturing the display panel) may be provided to the pixels PXa, PXb, and PXc to denaturalize or degrade the emission layers ELa, ELb, and ELc of the pixels PXa, PXb, and PXc or the common electrode E2 and reduce light emitting regions of the pixels PXa, PXb, and PXc, which will be referred to as generation of shrinkage. The third pixel electrode E1c may be formed to be a relatively wide area, and the gas generated in the region overlapping the third pixel electrode E1c may not be easily discharged when the display panel is manufactured. As the openings OP1 and OP2 are formed in the third pixel electrode E1c, the gas may be fluently discharged through the openings OP1 and OP2, and the shrinkage caused by the outgassing may be suppressed.

A pixel defining layer 190 including openings 195a, 195b, and 195c overlapping the pixel electrodes E1a, E1b, and E1c may be positioned on the second insulating layer IL2. The opening 195c overlapping the third pixel electrode E1c may include portions 195c1 to 195c6 divided by the openings OP1 and OP2. The opening 195c is shown to be divided into the six portions 195c1 to 195c6, and the number of the divided portions may be changeable. The pixel defining layer 190 may cover edges of the pixel electrodes E1a, E1b, and E1c. The pixel defining layer 190 may cover the openings OP1 and OP2 of the third pixel electrode E1c. The pixel defining layer 190 may overlap the data lines DLa, DLb, and DLc.

A first emission layer ELa, a second emission layer ELb, and a third emission layer ELc may be positioned on the first pixel electrode E1a, the second pixel electrode E1b, and the third pixel electrode E1c. The first emission layer ELa, the second emission layer ELb, and the third emission layer ELc may be positioned in the respectively corresponding openings 195a, 195b, and 195c of the pixel defining layer 190. The first emission layer ELa, the second emission layer ELb, and the third emission layer ELc may have substantially the same planar shapes as the respectively corresponding openings 195a, 195b, and 195c, and the planar shapes may be substantially equivalent to the light emitting regions of the respective pixels PXa, PXb, and PXc. The third emission layer ELc may include portions ELc1 to ELc6 divided by the openings OP1 and OP2. The portions ELc1 to ELc6 of the third emission layer ELc may be positioned in the corresponding portions 195c1 to 195c6 of the opening 195c of the pixel defining layer 190. The portions ELc1 to ELc6 of the third emission layer ELc may have substantially same planar shapes as the corresponding portions 195c1 to 195c6 of the opening 195c of the pixel defining layer 190, and the planar shapes may be substantially equivalent to the light emitting region of the third pixel PXc. When the portions ELc1 to ELc6 of the third emission layer ELc are divided, they may be positioned on one third pixel electrode E1c for receiving the same driving current based on the same data voltage and may emit light with substantially the same brightness per area.

A common electrode E2 may be positioned on the pixel defining layer 190 and the emission layers ELa, ELb, and ELc. The common electrode E2 may be the cathode of the light emitting diode LED. The pixel electrodes E1a, E1b, and E1c, the emission layers ELa, ELb, and ELc, and the common electrode E2 may configure the light emitting diode LED in the respective pixels PXa, PXb, and PXc.

A capping layer (not shown) may be positioned on the common electrode E2, and an encapsulation layer (not shown) may be positioned on the capping layer.

Figure 6:
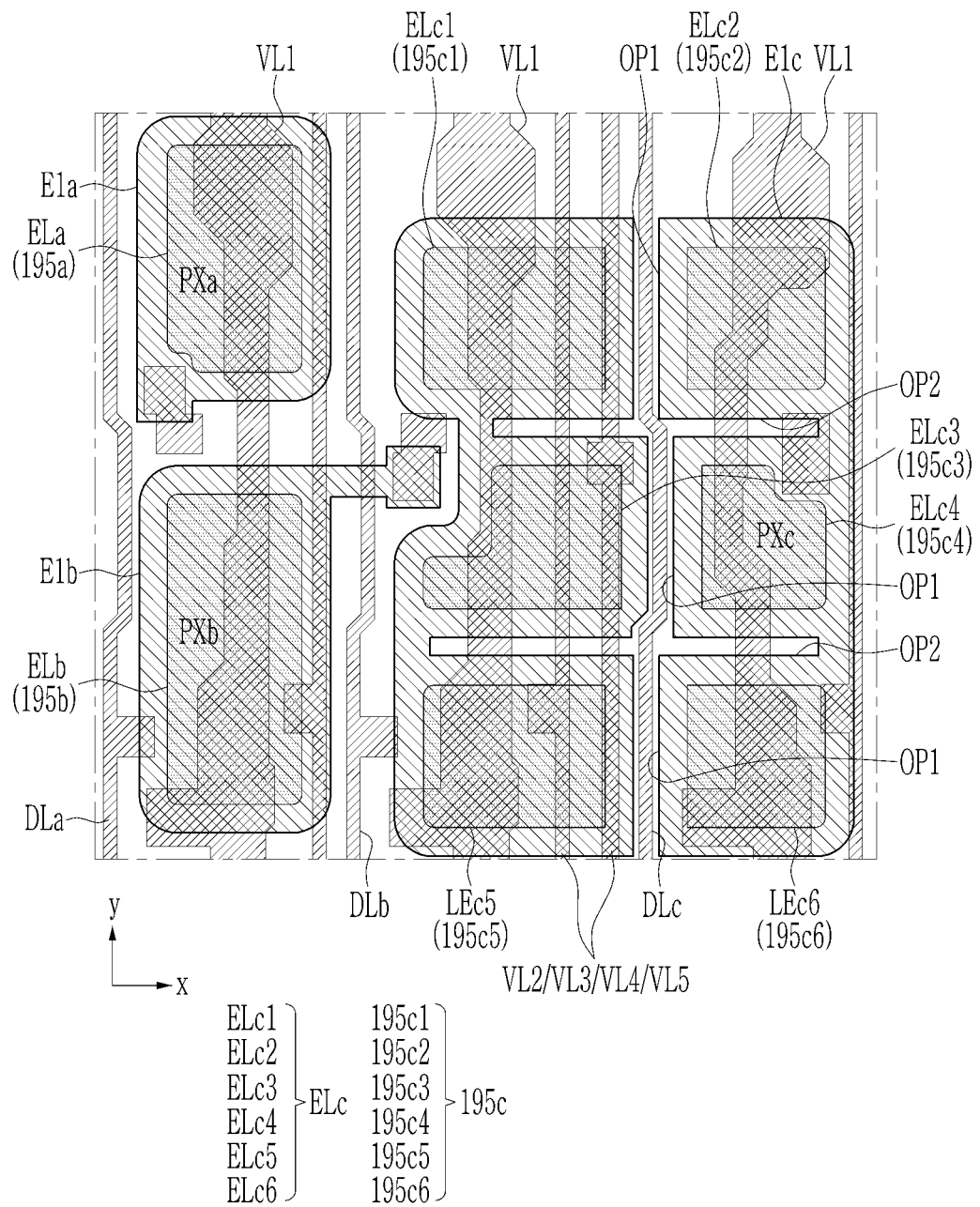
FIG. 6 and FIG. 7 show top plan views of pixels disposed in a display area of a light emitting display device according to an embodiment.
Figure 7:
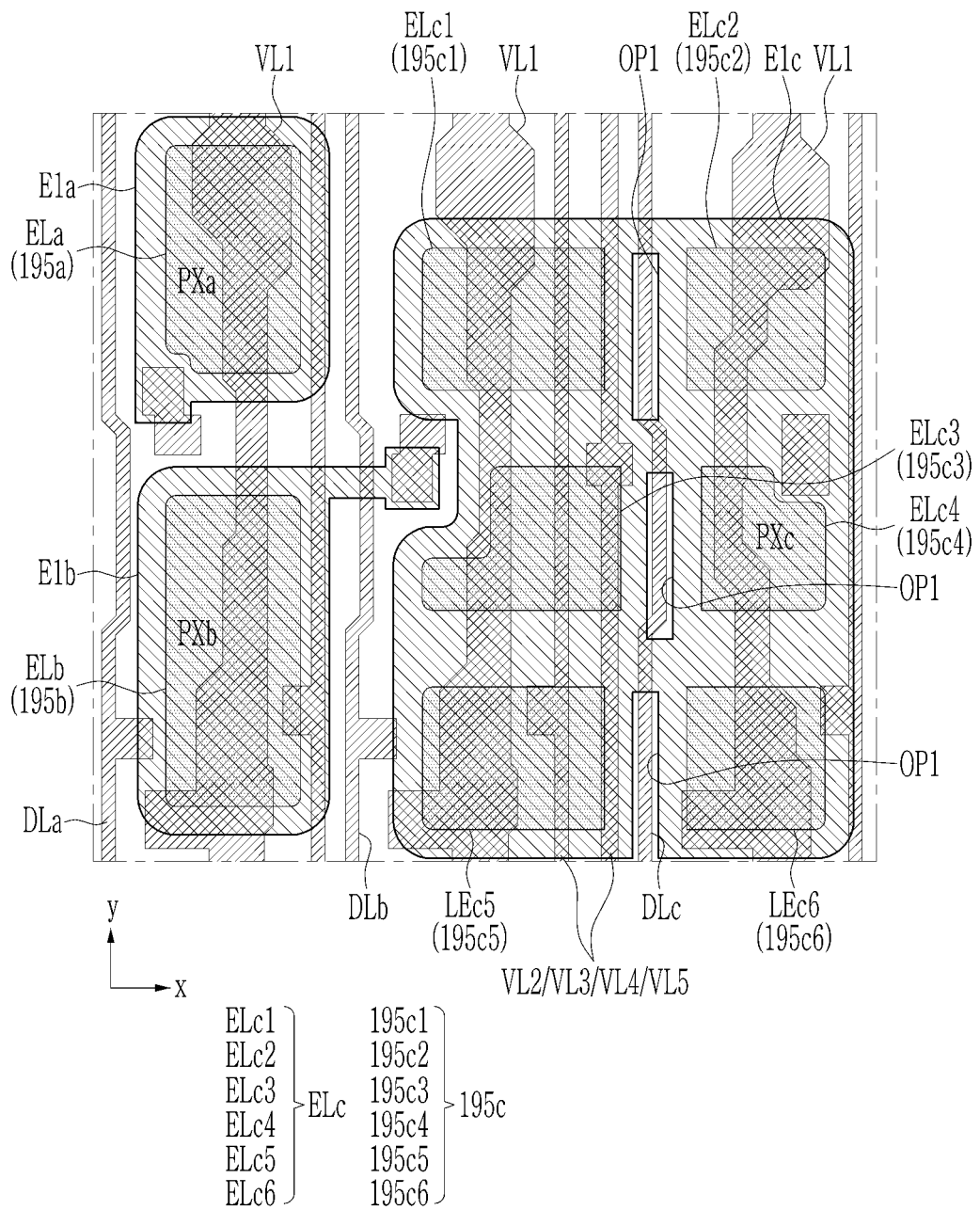

FIG. 6 and FIG. 7 show top plan views of pixels disposed in a display area of a light emitting display device according to an embodiment.

Referring to FIG. 6, the shape of the first opening OP1 formed in the third pixel electrode E1c is different, compared to the above-described embodiment. In detail, the first opening OP1 may be formed to divide the third pixel electrode E1c into two portions E1c1 and E1c2. The first opening OP1 may extend in the second direction y and may divide the third pixel electrode E1c into a first portion E1c1 that is on a left side of the first opening OP1 and a second portion E1c2 that is on a right side of the first opening OP1. The first opening OP1 may extend in parallel to the third data line DLc and may overlap the third data line DLc. A width of the first opening OP1 may be greater than a width of the third data line DLc. When the first opening OP1 is formed as described above, the region where the third pixel electrode E1c overlaps the third data line DLc may be minimized and the parasitic capacitance $C_{AK}$ between the third pixel electrode E1c and the third data line DLc may be further reduced. Although not shown, the first portion E1c1 and the second portion E1c2 of the third pixel electrode E1c may be electrically connected to each other and may receive the same driving current.

Referring to FIG. 7, there is a difference in that the second opening OP2 is not formed in the third pixel electrode E1c, compared to the above-described embodiment. Hence, the third emission layer ELc may include portions ELc1 and ELc2 divided by the first opening OP1. That is, the third emission layer ELc may include a first portion ELc1 positioned on the left side of the first opening OP1 and a second portion ELc2 positioned on the right side of the first opening OP1. When the third pixel electrode E1c and the third emission layer ELc are formed as described above, the light emitting region of the third pixel PXc may increase and a lifespan of the third pixel PXc may accordingly be increased. When the second opening OP2 is not formed in the third pixel electrode E1c, gas may be discharged through the first opening OP1, thereby improving the shrinkage caused by the outgassing. A plurality of first openings OP1 are spaced from each other, and they may be connected to each other and may be lengthily formed in the second direction y. As shown in FIG. 6, the first opening OP1 may be formed to divide the third pixel electrode E1c into two right and left portions.

Figure 8:
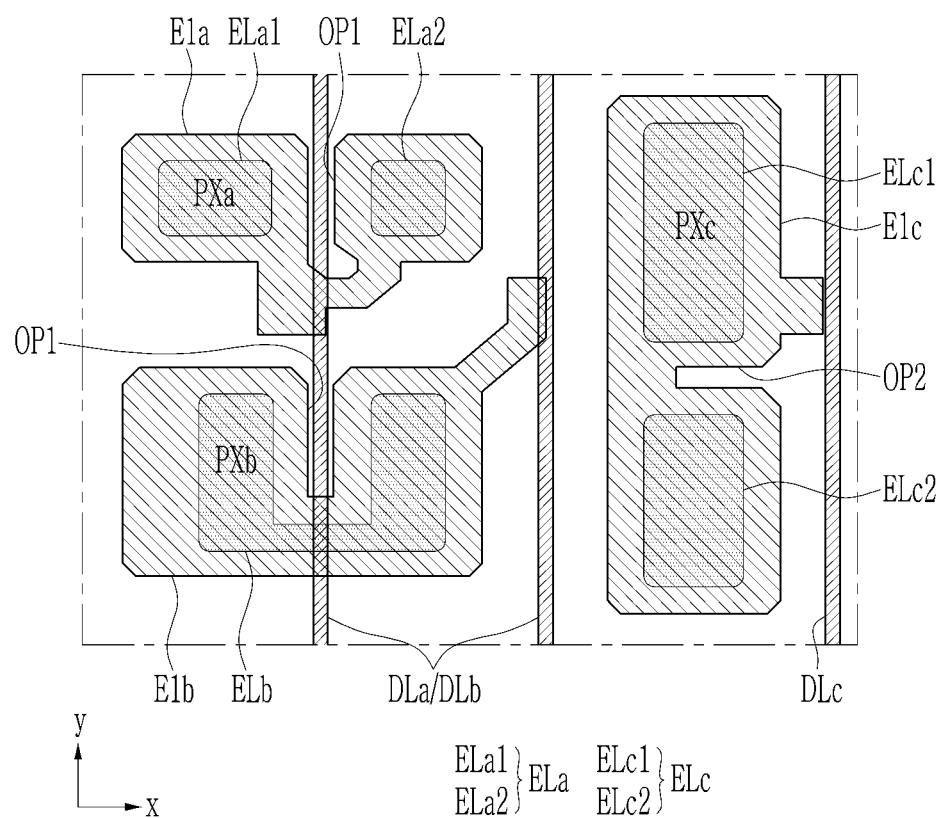
FIG. 8 shows a top plan view of pixels disposed in a display area of a light emitting display device according to an embodiment.

FIG. 8 shows a top plan view of pixels disposed in a display area of a light emitting display device according to an embodiment.

Referring to FIG. 8, an example in which a first opening OP1 extending in the second direction y is formed in the pixel electrodes E1a and E1b of the first pixel PXa and the second pixel PXb from among the pixels PXa, PXb, and PXc. The first opening OP1 may extend to be parallel to the first data line DLa or the second data line DLb and overlap the same. The first emission layer ELa may be divided into two portions ELa1 and ELa2 by the first opening OP1. The second emission layer ELb may be divided by the first opening OP1, and it may not be divided and may substantially have a U shape. That is, the second emission layer ELb may include portions positioned on the right, left, and bottom (or top) side of the first opening OP1, and they may be connected to each other.

As described, formation of the first opening OP1 in the first pixel electrode E1a and the second pixel electrode E1b may be advantageous in the structure in which the first pixel PXa and the second pixel PXb are lengthily formed in the first direction x and the third pixel PXc is lengthily formed in the second direction y. By forming the first opening OP1 in the first pixel electrode E1a and the second pixel electrode E1b, the region in which the first pixel electrode E1a and the second pixel electrode E1b overlap the first data line DLa or the second data line DLb may be reduced. Therefore, the parasitic capacitance $C_{AK}$ among the first pixel electrode E1a and the second pixel electrode E1b and the first data line DLa or the second data line DLb may be reduced.

In addition, the third pixel electrode E1c may include a second opening OP2 extending in the first direction x, and the gas is discharged through the second opening OP2, thereby improving the shrinkage caused by the outgassing. The third emission layer ELc may be divided into two portions ELc1 and ELc2 or may not be divided.

The first pixel PXa, the second pixel PXb, and the third pixel PXc may be disposed to be evenly distributed. For example, the first pixel PXa and the second pixel PXb may be alternately and repeatedly disposed in the second direction y. The first and second pixels PXa and PXb and the third pixel PXc may be alternately and repeatedly disposed in the first direction x. Disposal of the pixels PXa, PXb, and PXc is modifiable in many ways.

Figure 9:
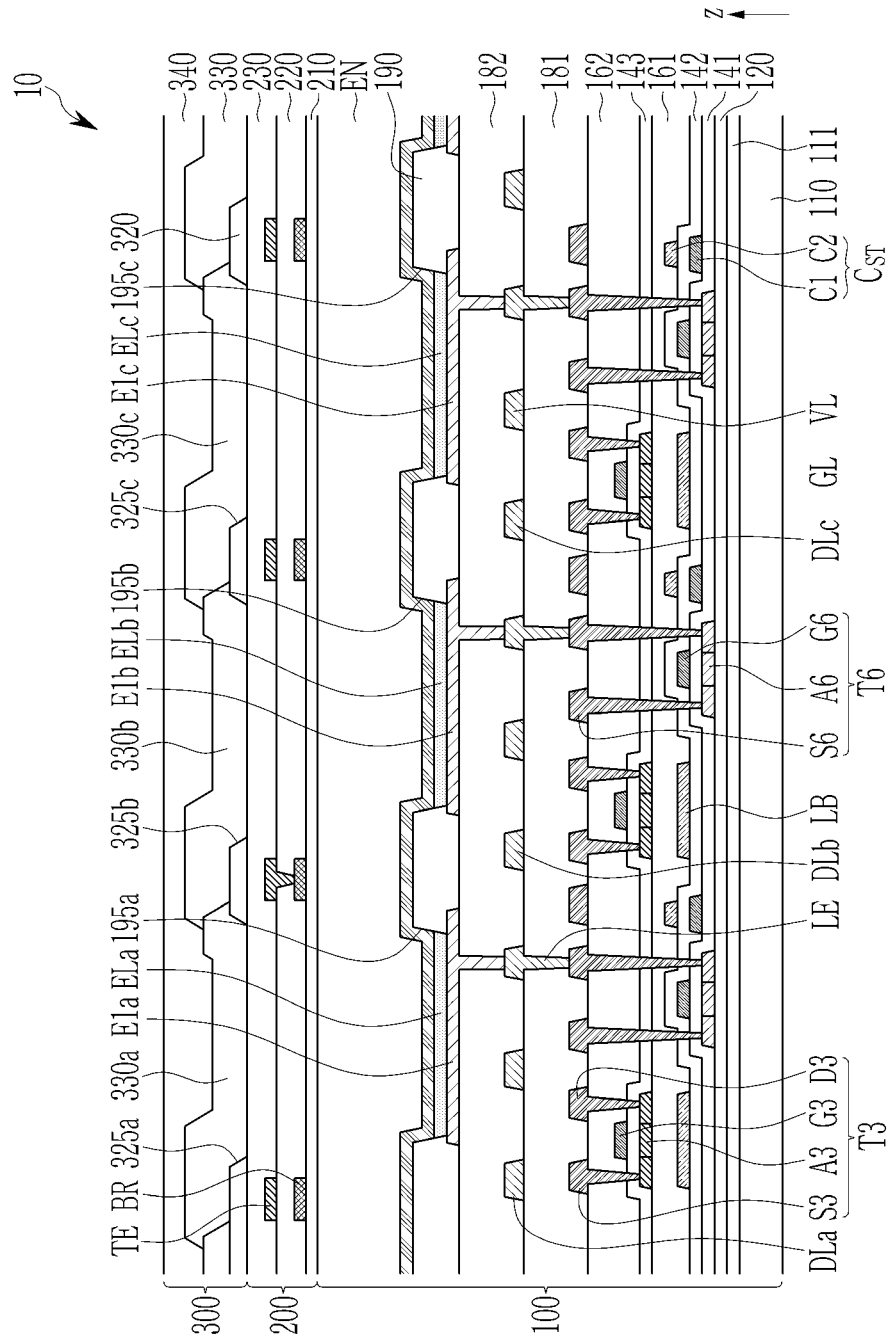
FIG. 9 shows a cross-sectional view of a display panel according to an embodiment.

FIG. 9 shows a cross-sectional view of a display panel according to an embodiment. Parts shown in FIG. 9 may correspond to substantially three pixel areas.

Referring to FIG. 9, the display panel 10 may include a display unit 100, a touch portion 200, and an antireflector 300.

The display unit 100 may include a substrate 110, transistors T3 and T6 formed on the substrate 110, a storage capacitor $C_{ST}$, and a light emitting diode LED. The light emitting diode LED may correspond to the pixel PX. FIG. 9 shows the third transistor T3 and the sixth transistor T6 from among the transistors T1 to T8 described with reference to FIG. 2, and the first, second, fifth, seventh, and eighth transistors T1, T2, T5, T7, and T8 may substantially have the same stacked structure as the sixth transistor T6, and the fourth transistor T4 may substantially have the same stacked structure as the third transistor T3.

The substrate 110 may be a flexible substrate including polymers such as a polyimide, a polyamide, or a polyethylene terephthalate. The substrate 110 may be a glass substrate.

A barrier layer 111 for preventing permeation of moisture or oxygen may be positioned on the substrate 110. The barrier layer 111 may include an inorganic insulating material such as a silicon nitride ($SiN_x$), a silicon nitride ($SiO_x$), or a silicon oxynitride ($SiO_xN_y$) and may be a single layer or a multilayer.

A buffer layer 120 may be positioned on the barrier layer 111. The buffer layer 120 may improve the characteristic of the semiconductor layer A6 by blocking impurities from the substrate 110 when the semiconductor layer A6 is formed, and may release the stress of the semiconductor layer A6 by planarizing the surface of the substrate 110. The buffer layer 120 may include an inorganic insulating material such as the silicon oxide, the silicon nitride, or the silicon oxynitride. The buffer layer 120 may include amorphous silicon.

The semiconductor layer A6 may be positioned on the buffer layer 120. The semiconductor layer A6 may include a first region, a second region, and a channel region between the two regions. The semiconductor layer A6 may include polysilicon.

A first gate insulating layer 141 may be positioned on the semiconductor layer A6. The first gate insulating layer 141 may include an inorganic insulating material such as the silicon nitride (SiN$_x$), the silicon oxide (SiO$_x$), or the silicon oxynitride (SiO$_x$N$_y$), and may be a single layer or a multilayer.

A first gate conductive layer including a gate electrode G6 and a first electrode C1 of the storage capacitor C$_{ST}$ may be positioned on the first gate insulating layer 141. The first gate conductive layer may include molybdenum (Mo), aluminum (Al), copper (Cu), and titanium (Ti), and may be a single layer or a multilayer.

A second gate insulating layer 142 may be positioned on the first gate conductive layer. The second gate insulating layer 142 may include an inorganic insulating material such as the silicon nitride, the silicon oxide, or the silicon oxynitride, and may be a single layer or a multilayer.

A second gate conductive layer including a light blocking layer LB and a second electrode C2 of the storage capacitor C$_{ST}$ may be positioned on the second gate insulating layer 142. The second electrode C2, the first electrode C1, and the second gate insulating layer 142 between them may configure the storage capacitor C$_{ST}$. The light blocking layer LB may prevent the characteristic deterioration of the semiconductor layer A3 by blocking external light from reaching the semiconductor layer A3. The second gate conductive layer may include molybdenum (Mo), aluminum (Al), copper (Cu), and titanium (Ti), and may be a single layer or a multilayer.

A first inter-layer insulating layer 161 may be positioned on the second gate conductive layer. The first inter-layer insulating layer 161 may include an inorganic insulating material such as the silicon nitride, the silicon oxide, or the silicon oxynitride, and may be a single layer or a multilayer. When the first inter-layer insulating layer 161 is a multilayer, the lower layer may include a silicon nitride and the upper layer may include a silicon oxide.

A semiconductor layer A3 may be positioned on the first inter-layer insulating layer 161. The semiconductor layer A3 may overlap the light blocking layer LB. The semiconductor layer A3 may include a first region, a second region, and a channel region between the two regions. The semiconductor layer A3 may include an oxide semiconductor. The semiconductor layer A3 may include at least one of zinc (Zn), indium (In), gallium (Ga), and tin (Sn). For example, the semiconductor layer A3 may include an indium-gallium-zinc oxide (IGZO).

A third gate insulating layer 143 may be positioned on the semiconductor layer A3. The third gate insulating layer 143 may include an inorganic insulating material such as the silicon nitride, the silicon oxide, or the silicon oxynitride, and may be a single layer or a multilayer.

A third gate conductive layer including a gate electrode G3 may be positioned on the third gate insulating layer 143. The third gate conductive layer may include molybdenum (Mo), aluminum (Al), copper (Cu), and titanium (Ti), and may be a single layer or a multilayer. For example, the third gate conductive layer may include a lower layer including titanium and an upper layer including molybdenum, and the lower layer may prevent fluorine (F) that is an etching gas from being spread when the upper layer is dry etched.

A second inter-layer insulating layer 162 may be positioned on the third gate conductive layer. The second inter-layer insulating layer 162 may include an inorganic insulating material such as the silicon nitride, the silicon oxide, or the silicon oxynitride, and may be a single layer or a multilayer. The second inter-layer insulating layer 162 may, for example, include a lower layer including a silicon nitride and an upper layer including a silicon oxide.

A first data conductive layer including first electrodes S3 and S6, second electrodes D3 and D6, and a gate line GL may be positioned on the second inter-layer insulating layer 162. The first electrode S3 and the second electrode D3 may be respectively connected to the first region and the second region of the semiconductor layer A3 through contact holes formed in the insulating layers 143 and 162. The first electrode S6 and the second electrode D6 may be respectively connected to the first region and the second region of the semiconductor layer A6 through contact holes formed in the insulating layers 141 142, 161, 143, and 162. The gate line GL may be a scan line GL1, an inverted scan line GL2, an initialization control line GL3, a bypass control line GL4, or a light emitting control line GL5. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may be a single layer or a multilayer. For example, the first data conductive layer may include a lower layer including a refractory metal such as molybdenum, chromium, tantalum, or titanium, an intermediate layer including a metal with low resistivity such as aluminum, copper, or silver, and an upper layer including a refractory metal. For example, the first data conductive layer may have a triple-layered structure such as titanium (Ti)-aluminum (Al)-titanium (Ti).

The semiconductor layer A3, the gate electrode G3, the first electrode S3, and the second electrode D3 may configure the third transistor T3. The semiconductor layer A6, the gate electrode G6, the first electrode S6, and the second electrode D6 may configure the sixth transistor T6. The light blocking layer LB may be electrically connected to the gate electrode G3 and may function as the lower gate electrode of the third transistor T3.

As described above, the semiconductor layer A3 may include an oxide semiconductor, and the semiconductor layer A6 may include a polycrystalline semiconductor. When the display panel 10 is driven at a high rate (e.g., the frequency of about 120 Hz) to increase displaying quality (particularly, video displaying quality), power consumption may be increased. Therefore, to simultaneously improve the displaying quality and the power consumption, still images may be driven at a low rate (e.g., about 1 Hz to about 30 Hz). The semiconductor layer A3 of the third transistor T3 that may generate a leakage current problem at a low rate driving includes the oxide semiconductor, thereby reducing the leakage current. Regarding the sixth transistor T6 that may generate a leakage current problem at low rate driving, the semiconductor layer A6 includes the polycrystalline semiconductor so it may have high electron mobility. That is, the third transistor T3 and the sixth transistor T6 of one pixel PX include different semiconductor materials, thus improving displaying quality, power consumption, and reliability.

A first planarization layer 181 may be positioned on the first data conductive layer. The first planarization layer 181 may be an organic insulating layer. For example, the first planarization layer 181 may include an organic insulating material such as a general-purpose polymer including polymethyl methacrylate and polystyrene, a polymer derivative having a phenol-based group, an acryl-based polymer, an imide-based polymer (e.g., a polyimide), or a siloxane-based polymer. The first insulating layer IL1 shown in FIG. 4 and FIG. 5 may correspond to the first planarization layer 181. Constitutional elements positioned between the substrate 110 and the first planarization layer 181 shown in FIG. 9 may correspond to the constitutional elements, which are not shown, between the substrate 110 and the first insulating layer IL1 shown in FIG. 4 and FIG. 5.

A second data conductive layer including data lines DLa, DLb, and DLc, a voltage line VL, and a connection electrode LE may be positioned on the first planarization layer 181. The voltage line VL may be the driving voltage line VL1, the reference voltage line VL2, the first initialization voltage line VL3, the second initialization voltage line VL4, or the common voltage line VL5. The voltage line VL may be the reference voltage line VL2, the first initialization voltage line VL3, the second initialization voltage line VL4, or the common voltage line VL5. The connection electrode LE may be connected to the second electrode D6 of the sixth transistor T6 through a contact hole formed in the first planarization layer 181. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may be a single layer or a multilayer. For example, the second data conductive layer may have a triple-layered structure such as titanium (Ti)-aluminum (Al)-titanium (Ti).

A second planarization layer 182 may be positioned on the second data conductive layer. The second planarization layer 182 may be an organic insulating layer. For example, the second planarization layer 182 may include an organic insulating material such as a general-purpose polymer including polymethyl methacrylate and polystyrene, a polymer derivative having a phenol-based group, an acryl-based polymer, an imide-based polymer, or a siloxane-based polymer. The second insulating layer IL2 shown in FIG. 4 and FIG. 5 may correspond to the second planarization layer 182.

A pixel conducting layer including pixel electrodes E1a, E1b, and E1c may be positioned on the second planarization layer 182. The pixel electrodes E1a, E1b, and E1c may be connected to the connection electrode LE through a contact hole formed in the second planarization layer 182. The pixel electrodes E1a, E1b, and E1c may be electrically connected to the second electrode D6 and may receive a driving current for controlling luminance of the light emitting diode LED. The pixel conducting layer may include a metal such as silver (Ag), lithium (Li), calcium (Ca), aluminum (Al), magnesium (Mg), or gold (Au). The pixel conducting layer may include a transparent conductive oxide (TCO) such as an indium tin oxide (ITO) or an indium zinc oxide (IZO). The pixel conducting layer may be a multilayer, and for example, it may have a triple-layered structure of ITO/silver (Ag)/ITO.

A pixel defining layer 190 may be positioned on the pixel conducting layer. The pixel defining layer 190 may have openings 195a, 195b, and 195c overlapping the pixel electrodes E1a, E1b, and E1c. The pixel defining layer 190 may include an organic insulating material such as a general-purpose polymer including polymethyl methacrylate and polystyrene, a polymer derivative having a phenol-based group, an acryl-based polymer, an imide-based polymer, a polyimide, or a siloxane-based polymer. The pixel defining layer 190 may be a black pixel defining layer 190 including a black dye or pigment. The black pixel defining layer 190 may increase a contrast ratio and may prevent reflection caused by the metal layer positioned below the same.

Emission layers ELa, ELb, and ELc may be positioned on the pixel electrodes E1a, E1b, and E1c. The emission layers ELa, ELb, and ELc may be positioned in the openings 195a, 195b, and 195c, and may include portions positioned outside the openings 195a, 195b, and 195c. The emission layers ELa, ELb, and ELc may include material layers for emitting light of primary colors of red, green, and blue. At least one of a hole injection layer, a hole transfer layer, an electron transfer layer, and an electron injection layer in addition to the emission layers ELa, ELb, and ELc may be positioned on the pixel electrodes E1a, E1b, and E1c.

A common electrode E2 may be positioned on the emission layers ELa, ELb, and ELc, and the pixel defining layer 190. The common electrode E2 may be provided in common to the pixels PXa, PXb, and PXc. The common electrode E2 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), or lithium (Li). The common electrode E2 may include a transparent conductive oxide (TCO) such as the indium tin oxide (ITO) or the indium zinc oxide (IZO).

An encapsulation layer EN may be positioned on the common electrode E2. The encapsulation layer EN may prevent moisture and oxygen from permeating from the outside by encapsulating the light emitting diode LED. The encapsulation layer EN may be a thin film encapsulation layer including at least one inorganic layer and at least one organic layer. For example, the encapsulation layer EN may have a triple-layered structure of inorganic layer/organic layer/inorganic layer.

A touch portion 200 may be positioned on the encapsulation layer EN.

The touch portion 200 may include a first insulating layer 210 positioned on the encapsulation layer EN. The first insulating layer 210 covers the encapsulation layer EN to protect the encapsulation layer EN and prevent permeation of moisture. The first insulating layer 210 may reduce the parasitic capacitance between the common electrode E2 and the touch electrode TE.

A first touch conducting layer including a bridge BR may be positioned on the first insulating layer 210, and a second insulating layer 220 may be positioned on the first touch conducting layer. A second touch conducting layer including a touch electrode TE may be positioned on the second insulating layer 220, and a passivation layer 230 may be positioned on the second touch conducting layer.

The touch electrode TE may include first touch electrodes and second touch electrodes for forming a mutual sensing capacitor. The bridge BR may electrically connect the first touch electrodes or the second touch electrodes. For example, the first touch electrodes that are positioned near each other and are spaced from each other may be connected to the bridge BR through the contact holes formed in the second insulating layer 220, and may be electrically connected through the bridge BR.

The first insulating layer 210 and the second insulating layer 220 may include an inorganic insulating material such as the silicon nitride, the silicon oxide, or the silicon oxynitride, and may be a single layer or a multilayer. The passivation layer 230 may include an inorganic insulating material such as the silicon nitride, the silicon oxide, or the silicon oxynitride or may include an organic material such as the acryl-based polymer or an imide-based resin.

The first touch electrode layer and the second touch electrode layer may have mesh shapes having openings overlapping the pixels PXa, PXb, and PXc. The first touch electrode layer and the second touch electrode layer may include a metal such as aluminum (Al), copper (Cu), titanium (Ti), molybdenum (Mo), silver (Ag), chromium (Cr), or nickel (Ni).

An antireflector 300 may be positioned on the touch portion 200.

The antireflector 300 may include a light blocking layer 320 and color filters 330*a*, 330*b*, and 330*c*.

The light blocking layer 320 may overlap the pixel defining layer 190 of the display unit 100 and may have a lesser width than the pixel defining layer 190. The light blocking layer 320 may have openings 325*a*, 325*b*, and 325*c* overlapping the openings 195*a*, 195*b*, and 195*c* of the pixel defining layer 190.

The color filters 330*a*, 330*b*, and 330*c* may be positioned on the light blocking layer 320. The color filters 330*a*, 330*b*, and 330*c* may include a first color filter 330*a* for transmitting a first color, a second color filter 330*b* for transmitting a second color, and a third color filter 330*c* for transmitting a third color. An overcoat layer 340 may be positioned on the color filters 330*a*, 330*b*, and 330*c*.

The antireflector 300 may prevent external light input from the outside from being reflected by a wire and being visible. The light blocking layer 320 and the color filters 330*a*, 330*b*, and 330*c* may be combined to each other and may function as an antireflection layer. In the above-described structure, a polarization layer may not be needed as an antireflection layer, thereby increasing light outputting efficiency and reducing the thickness of the display panel 10.

The stacked structure of the display panel 10 and disposal of the constituent elements are modifiable in various ways.

While this disclosure has been described in connection with embodiments, it is to be understood that the inventive concept is not limited to the disclosed embodiments, but, on the contrary, is intended to cover various modifications and equivalent arrangements included within the spirit and scope of the appended claims.

What is claimed is:

1. A light emitting display device comprising:
    a substrate;
    a first insulating layer disposed on the substrate;
    a data line disposed on the first insulating layer and transmitting a data voltage;
    a second insulating layer disposed on the data line;
    a pixel electrode disposed on the second insulating layer; and
    an emission layer disposed on the pixel electrode,
    wherein the pixel electrode includes at least one first opening extending in parallel to the data line and overlapping the data line.

2. The light emitting display device of claim 1, wherein the data line traverses the pixel electrode.

3. The light emitting display device of claim 1, wherein the emission layer includes portions divided with the at least one first opening therebetween.

4. The light emitting display device of claim 1, further comprising
    a pixel defining layer disposed on the second insulating layer and having an opening overlapping the pixel electrode,
    wherein the opening includes portions spaced with the at least one first opening therebetween.

5. The light emitting display device of claim 1, wherein the pixel electrode further includes a second opening extending in a direction crossing an extending direction of the at least one first opening.

6. The light emitting display device of claim 5, wherein the first opening is connected to the second opening.

7. The light emitting display device of claim 5, wherein the emission layer includes portions spaced with the second opening therebetween.

8. The light emitting display device of claim 1, wherein the at least one first opening includes a plurality of first openings connected to each other.

9. The light emitting display device of claim 1, wherein the at least one first opening includes a plurality of first openings separated from each other.

10. The light emitting display device of claim 1, further comprising
    a first pixel and a second pixel disposed in a direction in which the at least one first opening extends, and a third pixel disposed near the first pixel and the second pixel in a direction crossing the direction in which the at least one first opening extends,
    wherein the pixel electrode is a pixel electrode of the third pixel.

11. The light emitting display device of claim 10, wherein the first pixel, the second pixel, and the third pixel respectively display red, green, and blue, and a region of the third pixel is greater than a region of each of the first pixel and the second pixel.

12. The light emitting display device of claim 1, further comprising
    a first pixel and a second pixel disposed in a direction in which the at least one first opening extends, and a third pixel disposed near the first pixel and the second pixel in a direction crossing the direction in which the at least one first opening extends,
    wherein the pixel electrode is a pixel electrode of the first pixel or the second pixel.

13. An electronic device comprising a light emitting display device, the light emitting display device comprising:
    a first pixel, a second pixel, and a third pixel displaying different colors and respectively including a first pixel electrode, a second pixel electrode, and a third pixel electrode, wherein the third pixel includes an emission layer disposed on the third pixel electrode; and
    a first data line, a second data line, and a third data line for transmitting a data voltage to the first pixel, the second pixel, and the third pixel, respectively,
    wherein, in a top plan view, the third data line traverses the third pixel electrode, and
    in the top plan view, the third pixel electrode includes a first opening overlapping the third data line.

14. The electronic device of claim 13, wherein
    the first opening extends in parallel to the third data line, and a width of the first opening is greater than a width of the third data line.

15. The electronic device of claim 13, wherein
    the emission layer includes portions disposed on a first side and a second side of the first opening and spaced from each other.

16. The electronic device of claim 13, wherein
    the third pixel electrode further includes a second opening extending in a direction crossing an extending direction of the first opening.

17. The electronic device of claim 16, wherein
    the first opening is connected to the second opening.

18. The electronic device of claim 16, wherein
    the emission layer includes portions disposed on a first side and a second side of the second opening and spaced from each other.

19. The electronic device of claim 13, wherein
    the first pixel, the second pixel, and the third pixel respectively display a red color, a green color, and a blue color, and a region of the third pixel is greater than a region of each of the first pixel and the second pixel.

20. The electronic device of claim 13, further comprising:
a driving voltage line traversing the third pixel electrode to extend in a same direction as a direction in which the third data line extends, and transmitting a driving voltage to the third pixel.

\* \* \* \* \*